United States Patent [19]
Tateishi

[11] Patent Number: 5,790,613
[45] Date of Patent: Aug. 4, 1998

[54] CYCLE SLIP DETECTOR AND PHASE LOCKED LOOP CIRCUIT AND DIGITAL SIGNAL REPRODUCING APPARATUS USING THE SAME

[75] Inventor: Kiyoshi Tateishi, Tsurugashima, Japan

[73] Assignee: Pioneer Electronic Corporation, Tokyo, Japan

[21] Appl. No.: 672,046

[22] Filed: Jun. 26, 1996

[30] Foreign Application Priority Data

Jul. 7, 1995  [JP]  Japan ................................. 7-172277

[51] Int. Cl.$^6$ ................................. H03D 3/24; H04L 7/00
[52] U.S. Cl. ........................ 375/376; 375/317; 375/355; 375/375
[58] Field of Search ................................. 375/376, 317, 375/294, 355, 375; 331/1 R, 18, 25; 327/147, 156

[56] References Cited

U.S. PATENT DOCUMENTS 5,412,692  5/1995  Uchida ................................. 375/317
5,537,442  7/1996  Nakamura et al. ................. 375/330

Primary Examiner—Stephen Chin
Assistant Examiner—Frederick Yu
Attorney, Agent, or Firm—Sughrue, Mion, Zinn, Macpeak & Seas, PLLC

[57] ABSTRACT

A cycle slip detector of the invention has first and second comparators. The first comparator determines that the value of a phase error signal being supplied thereto is larger than a first threshold value near a maximum value possibly taken by the phase error signal, and responsively generates a first determining signal. The second comparator determines that the value of the phase error signal being supplied thereto is smaller than a second threshold value of a minimum value possibly taken by the phase error signal, and responsively generates a second determining signal. The cycle slip detector generates a cycle slip detecting signal when the first determining signal and the second determining signal generate in succession. By applying the cycle slip detector as mentioned, it is possible to provide a phase locked loop circuit having a wide frequency range in which a withdraw or pull-in operation is permitted. If the cycle slip detector is applied to a digital signal reproducing apparatus, it is possible to reduce an access time required to read a signal at a specified recording position on an recording medium from the unlock state of the phase locked loop circuit.

10 Claims, 14 Drawing Sheets

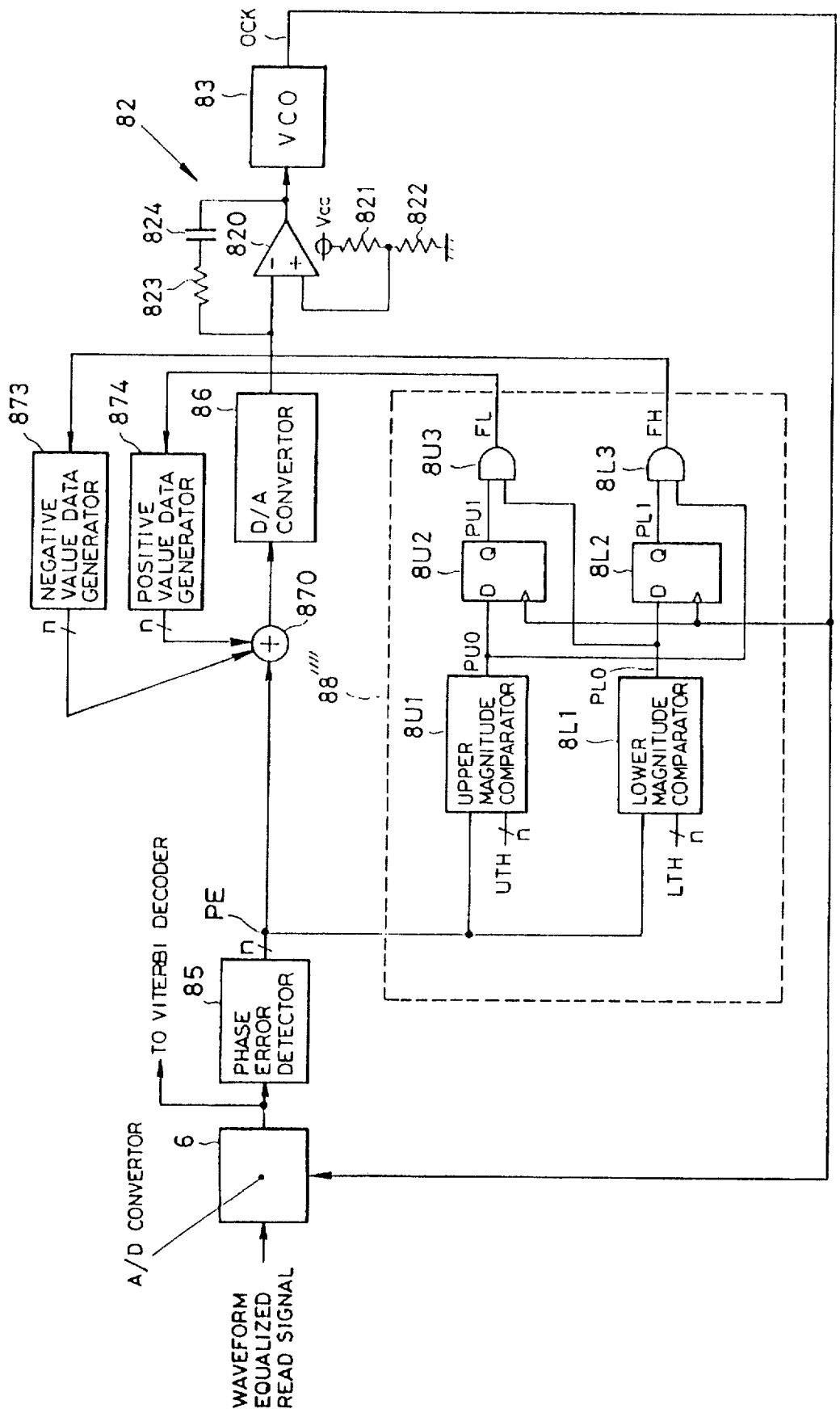

CYCLE SLIP DETECTOR AND PHASE LOCKED LOOP CIRCUIT AND DIGITAL SIGNAL REPRODUCING APPARATUS USING THE SAME

BACKGROUND OF THE INVENTION

1. Field of the Invention

The present invention relates to a cycle slip detector for detecting transitions of periods in a phase error signal having cyclic values, to a phase locked loop circuit and to a digital signal reproducing apparatus using the same.

2. Description of the Related Arts

In a disk drive unit such as an optical disk drive and a magnetic disk drive employing a hard disk, a floppy disk or the like, a so-called self clocking technique is commonly used for reproducing a digital signal from on the basis of a signal read from the disk. The self clocking technique generally involves the use of a PLL (phase locked loop) circuit for generating a reproduced clock signal which is bit-synchronized or synchronized in phase with the read signal.

FIG. 1 illustrates the configuration of an optical disk drive unit to which the self clocking technique is applied.

Referring specifically to FIG. 1, on an optical disk 1, there are recorded encoded signals produced by applying predetermined encoding, appropriate to the disk, to original digital information signal. The optical disk 1 is irradiated with a reading light beam emitted from a pickup 3 while being rotated by a spindle motor 2. The reading light beam incident to the optical disk 1 reflects on its recording surface, and directs back to the pickup 3 as a return light beam having a level or a component corresponding to a digital signal recorded on the recording surface. The pickup 3 receives the return light beam and transduces it to an electrical signal which is supplied to an RF (radio frequency) amplifier 4 as a read signal.

The RF amplifier 4 amplifies the supplied read signal which is then supplied to a waveform equalizer 5. The waveform equalizer 5 subjects waveform correction to the amplified read signal from the RF amplifier 4 in order to remove intercode interference, and supplies the processed read signal to an analog input terminal of an A/D (analog-to-digital) convertor 6. The read signal waveform-equalized by the waveform equalizer 5 is also supplied to an ATC (automatic threshold controller) 7. The ATC 7 determines the level of the read signal with a threshold value suitable to the supplied read signal, and generates a pulse signal at a level corresponding to the determined level of the read signal. The pulse signal is then supplied to a PLL circuit 8.

The PLL circuit 8 comprises a phase comparator 81 supplied with the pulse signal from the ATC 7 as one input, a loop filter 82 for passing a low frequency component of an output phase error signal of the phase comparator 81, and a VCO (voltage controlled oscillator) 83 supplied with a low-band phase error signal, after passing through the loop filter 82, as a control voltage input. An oscillating signal of the VCO 83 is fed to another input of the phase comparator 81. In this way, the phase comparator 81 generates a phase error signal in accordance with a phase difference between the pulse signal from the ATC 7 and the oscillating signal from the VCO 83. Since the VCO 83 has its oscillating frequency controlled to eliminate the phase difference, the oscillating signal of the VCO 83 serves as a reproduced clock signal synchronized with a basic cycle of the pulse signal from the ATC 7.

The reproduced clock signal is supplied to the A/D convertor 6. The A/D convertor 6 samples a waveform-equalized read signal from the waveform equalizer 5 at sampling timing based on the reproduced clock signal, and supplies a digital signal having a value corresponding to the level of the sampled read signal to a decoding system, not shown. In the decoding system, the digital signal from the A/D convertor 6 is decoded to reproduce an original digital information signal.

In the disk drive unit configured as described above, the PLL circuit 8 has a lock-in range set relatively narrow, so that it is not allowed to perform a pull-in operation unless the frequency of an input pulse signal becomes equal to a predefined frequency which falls under the lock-in range. Thus, the rotational speed of the optical disk 1 is controlled by the spindle motor 2 such that the PLL circuit 8 performs the pull-in operation only after the frequency of the input pulse signal becomes equal to the predefined frequency. For this reason, it takes a long time for the PLL circuit 8 in an unlock state to lock in. This is a disadvantage for reducing an access time required to read a signal at a specified recording position on the optical disk 1 from the unlock state of the phase locked loop circuit.

OBJECTS AND SUMMARY OF THE INVENTION

The present invention has been made in view of the problem mentioned above, and its object is to provide a phase locked loop circuit having a wide frequency range in which a pull-in operation is permitted, and a cycle slip detector suitable for such a phase locked loop circuit. Another object of the present invention is to provide a digital signal reproducing apparatus which is capable of reducing an access time required to read a signal at a specified recording position on a recording medium from the unlock state of the phase locked loop circuit.

The cycle slip detector according to the present invention is a cycle slip detector for detecting a cycle slip in phase errors, which is characterized by comprising first determining means for determining that the value of a phase error signal being supplied thereto is larger than a first threshold value near a maximum value possibly taken by the phase errors to generate a first determining signal; second determining means for determining that the value of the phase error signal being supplied thereto is smaller than a second threshold value near a minimum value possibly taken by the phase errors to generate a second determining signal; and detecting signal generating means for generating a cycle slip detecting signal when the first determining signal and the second determining signal are generated in succession.

A phase locked loop circuit according to the present invention is a phase locked loop circuit for generating a phase synchronizing signal synchronized in phase with an input signal, which is characterized by comprising error detecting means for detecting a phase error in the input signal and for generating a phase error signal in accordance therewith; a cycle slip detector including first determining means for determining that the value of the phase error signal is larger than a first threshold value near a maximum value possibly taken by the phase errors to generate a first determining signal; second determining means for determining that the value of the phase error signal is smaller than a second threshold value near a minimum value possibly taken by the phase errors to generate a second determining signal; and detecting signal generating means for generating a cycle slip detecting signal when the first determining signal and the second determining signal are generated in succession; an adding means for adding the phase error signal and the cycle slip detecting signal to generate a sum signal in accordance with an addition value of both the signals; a loop filter for passing a low frequency component of the sum signal therethrough; and oscillating means for generating the phase synchronizing signal having an oscillating frequency and a phase in accordance with the low frequency component.

A digital signal reproducing apparatus according to the present invention is a digital signal reproducing apparatus for reproducing a digital signal from a read signal produced by reading a recording medium, which is characterized by comprising digitizing means for converting the reading signal to a digital form using a sampling timing signal and for outputting a digital signal; error detecting means for detecting a phase error in sampling timing of the digitizing means relative to the read signal to generate a phase error signal in accordance with the phase error; a cycle slip detector including first determining means for determining that the value of the phase error signal is larger than a first threshold value near a maximum value possibly taken by the phase errors to generate a first determining signal; second determining means for determining that the value of the phase error signal is smaller than a second threshold value near a minimum value possibly taken by the phase errors to generate a second determining signal; and detecting signal generating means for generating a cycle slip detecting signal when the first determining signal and the second determining signal are generated in succession; adding means for adding the phase error signal and the cycle slip detecting signal to generate a sum signal in accordance with an addition value of both the signals; a loop filter for passing a low frequency component of the sum signal therethrough; oscillating means for generating the sampling timing signal having an oscillating frequency and a phase in accordance with the low frequency component; and decoding means for decoding the digital signal.

According to the cycle slip detector of the present invention, when determining that the value of a supplied phase error signal is larger than a first threshold value near a maximum value possibly taken by phase errors, a first determining signal is responsively generated. Also, when determining that the value of the supplied phase error signal is smaller than a second threshold value near a minimum value possibly taken by the phase errors, a second determining signal is responsively generated. Then, when the first determining signal and the second determining signals are generated in succession, a cycle slip detecting signal is generated.

According to the phase locked loop circuit of the present invention, the cycle slip detecting signal is added to the phase error signal supplied to a loop filter.

According to the digital signal reproducing apparatus of the present invention, a read signal is sampled based on a sampling timing signal, converted to a digital form, and outputted as a digital signal. Also, a phase error signal is generated in accordance with phase errors in sampling timing in the digital conversion of the read signal. A phase synchronizing signal generated by the phase locked loop circuit is used as a sampling timing signal.

BRIEF DESCRIPTION OF THE DRAWINGS

FIG. 15 is a block diagram illustrating a specific configuration of a digital summing type phase locked loop circuit of a further embodiment according to the present invention.

DETAILED DESCRIPTION OF THE PREFERRED EMBODIMENTS

The present invention will hereinafter be described in detail with reference to the accompanying drawings.

Figure 1:
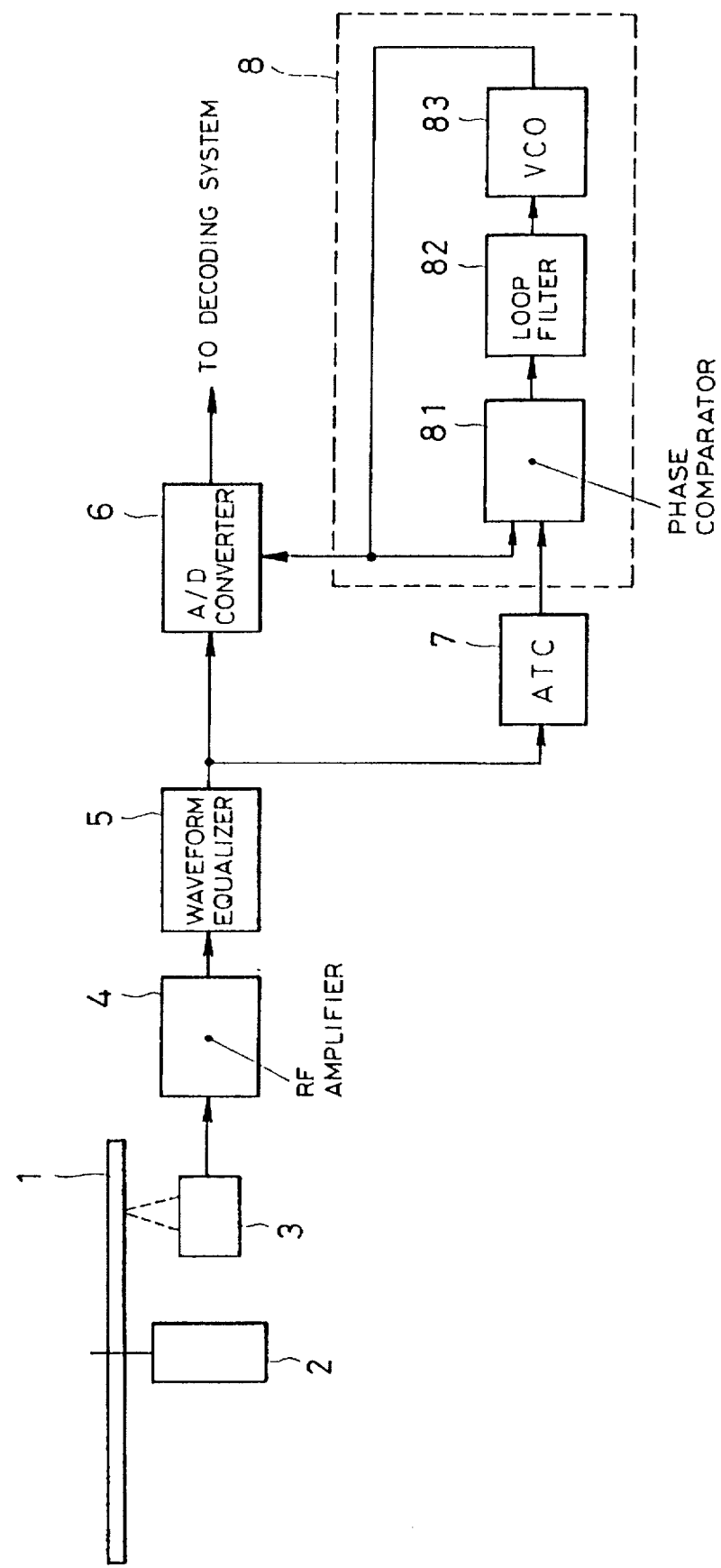
FIG. 1 is a block diagram illustrating the configuration of an optical disk drive unit to which a conventional self clocking technique is applied.
Figure 2:
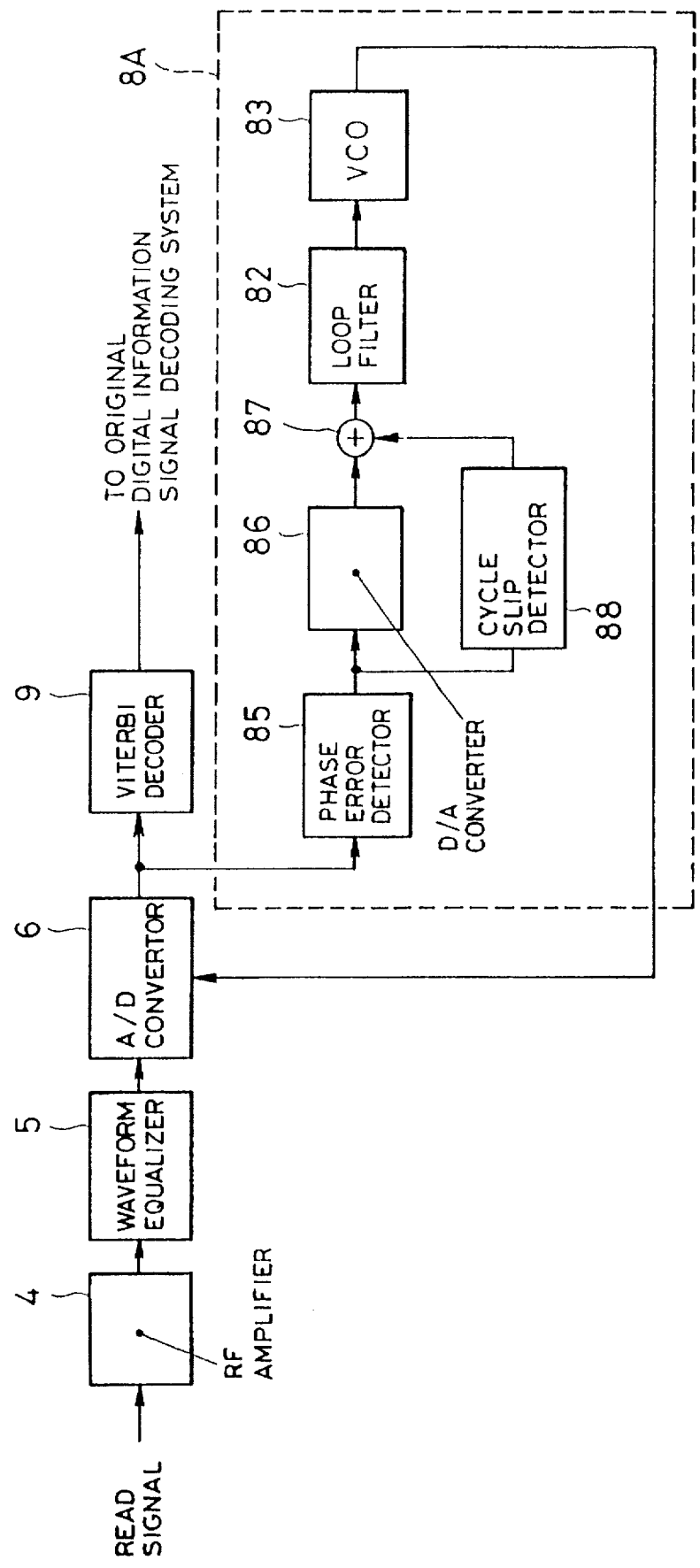
FIG. 2 is a block diagram illustrating a basic configuration of a digital signal reproducing apparatus of an embodiment to which a phase locked loop circuit according to the present invention is applied.

FIG. 2 illustrates the configuration of a digital signal reproducing apparatus of an embodiment to which a phase locked loop circuit according to the present invention is applied, wherein similar parts to those in FIG. 1 are designated the same reference numerals.

Referring specifically to FIG. 2, a read signal from a pickup is supplied to an A/D convertor 6 through an RF amplifier 4 and a waveform equalizer 5. The read signal converted into a digital form by the A/D convertor 6 is supplied to a Viterbi decoder 9 for Viterbi decoding, and further is converted to an original digital information signal by a decoding system, not shown.

The digital output signal of the A/D convertor 6 is also supplied to a phase error detector 85 in a PLL circuit 8A which functions as a phase locked loop circuit. The phase error detector 85, unlike the phase comparator 81 shown in FIG. 1, detects phase errors directly from the digital output signal of the A/D convertor 6, i.e., from a series of sampled value data themselves. Describing an example in detail, the phase error detector 85 detects phase errors on the basis of the principle represented by FIGS. 3 and 4.

Figure 3:
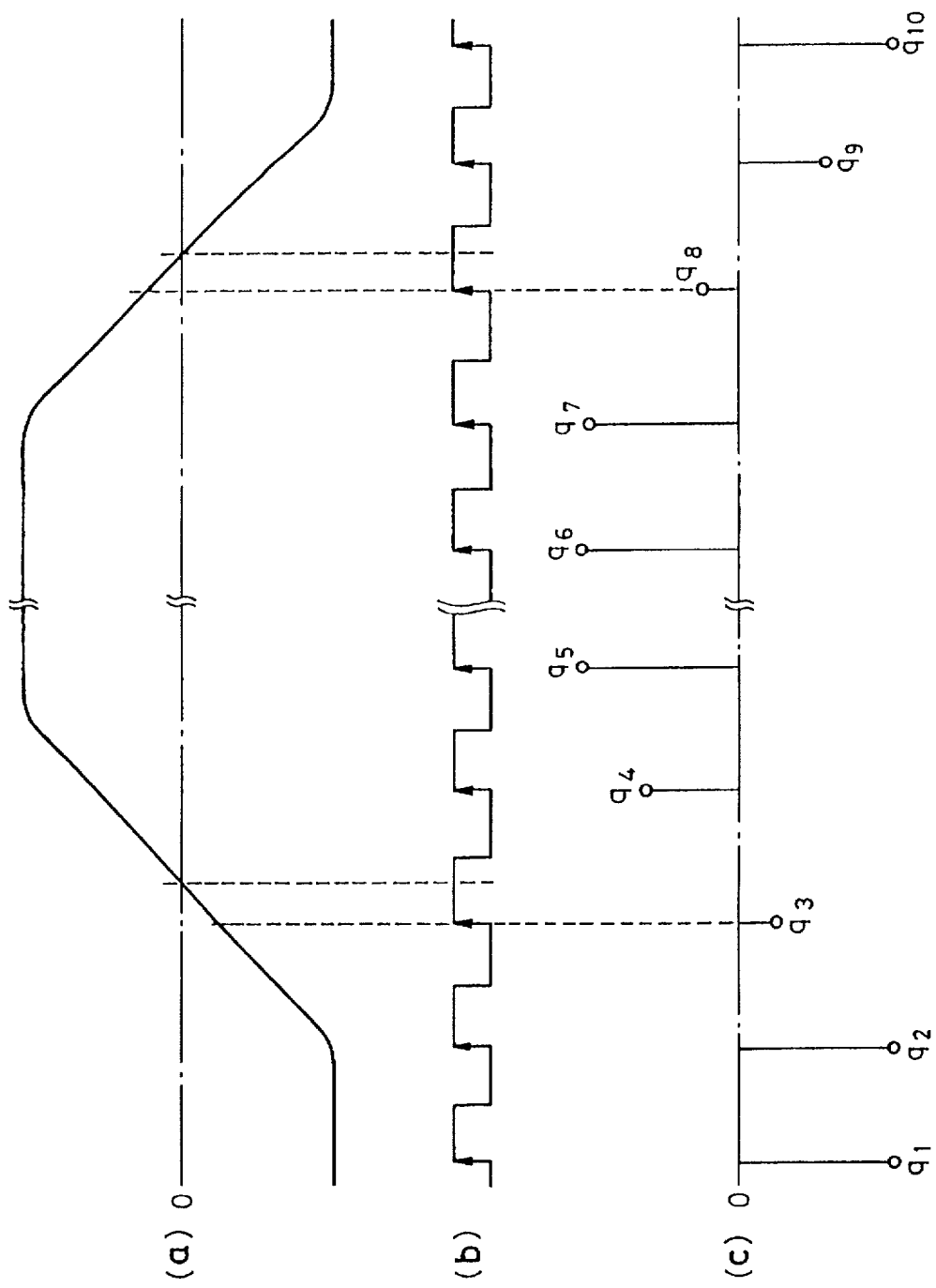
FIG. 3 is a time chart illustrating the principles of an operation of a phase error detector for detecting an advanced phase in the digital signal reproducing apparatus of FIG. 2.

Referring first to FIG. 3, a read signal illustrated in (a), which is an analog input to the A/D convertor 6, is sampled at every sampling timing of the A/D convertor 6 (every rising edge timing of a sampling clock illustrated in (b)) to be converted to a series of n-bit data corresponding to sampled values q1-q10 as illustrated in (c). In a transition from a sampled value q3 to a sampled value q4, the sampled values change from a negative value to a positive value. Also, an absolute value of the sampled value q3 is smaller than an absolute value of the sampled value q4, i.e., the sampled value q3 is closer to the zero level. In this event, since the transition from the sample value q3 to the sample value q4 is on the upward trend, n-bit data corresponding to the sampled value q3 is used as a phase error signal as it is. In a transition from a sampled value q8 to a sampled value q9, the sample values change from a positive value to a negative value, and an absolute value of the sampled value q8 is smaller than an absolute value of the sampled value q9, i.e., the sampled value q8 is closer to the zero level. Since the transition from the sampled value q8 to the sampled value q9 is on the downward trend, n-bit data corresponding to the sampled value q8 with its polarity inverted is used as a phase error signal. The foregoing state corresponds to a state in which, with a zero-cross point of the read signal (a) determined as a reference phase point, the sampling timing of the A/D convertor 6 closest to the reference phase point occurs earlier than the reference phase point, and reproduced pulses supplied to the A/D convertor 6 have a phase advanced by a portion corresponding to the absolute value of the sampled value q3 or q8.

Figure 4:
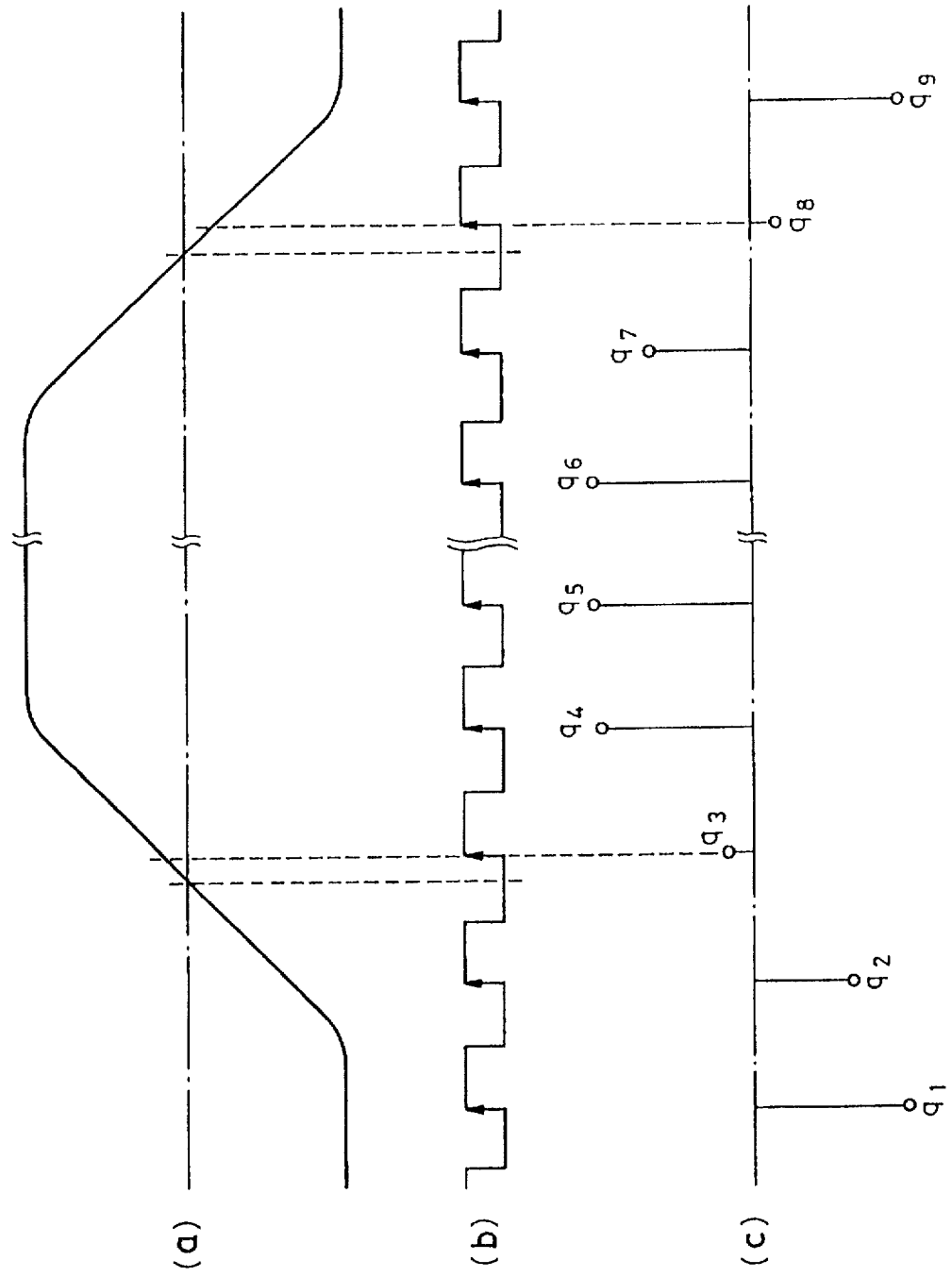
FIG. 4 is a time chart illustrating the principles of an operation of the phase error detector for detecting a delayed phase in the digital signal reproducing apparatus of FIG. 2.

On the other hand, FIG. 4 illustrates a state in which the reproduced pulses have a phase delayed by a portion corresponding to the absolute value of the sampled value q3 or q8, contrary to the above-mentioned case of FIG. 3. In FIG. 4, a sampling timing of the A/D convertor 6 closest to the reference phase point of the read signal (a) occurs later than the reference phase point. In a transition from a sampled value q2 to a sampled value q3, the sampled values change from a positive value to a negative value, however, an absolute value of the sampled value q3 is smaller than an absolute value of the sampled value q2, i.e., the sampled value q3 is closer to the zero level. In this event, since the transition from the sampled value q2 to the sampled value q3 is on the upward trend, n-bit data corresponding to the sampled value q3 is used as a phase error signal as it is. In a transition from a sampled value q7 to a sampled value q8, the sampled values change from a positive value to a negative value, and an absolute value of the sampled value q8 is smaller than the sampled value q7, i.e., the sampled value q8 is closer to the zero level. Since the transition from the sampled value q7 to the sampled value q8 is on the downward trend, n-bit data corresponding to the sampled value q8 with its polarity inverted is used as a phase error signal.

As described above, the phase error detector 85 updates the phase error every time an edge of the read signal reaches, and generates a phase error signal as positive or negative digital signal.

Turning back to FIG. 2, in the phase locked loop circuit 8A, the phase error signal is converted to an analog form by a D/A (digital-to-analog) convertor 86, and supplied to an adder circuit 87 as well as to a cycle slip detector 88. The cycle slip detector 88, having a configuration later described, detects the timing the phase error signal transits from a maximum value to a minimum value and the timing the phase error signal transits from the minimum value to the maximum value, i.e., a cycle slip, and supplies the adder circuit 87 with a detecting signal having a predetermined waveform indicating the cycle slip. The adder circuit 87 adds the two input signals supplied thereto, and supplies a loop filter 82 with a signal in accordance with the sum of the two input signals. The loop filter 82 supplies a VCO 83 with a low frequency component of the supplied signal as a control voltage, so that the VCO 83 supplies the A/D convertor 6 with reproduced pulses at an oscillating frequency responsive to the control voltage.

Figure 5:
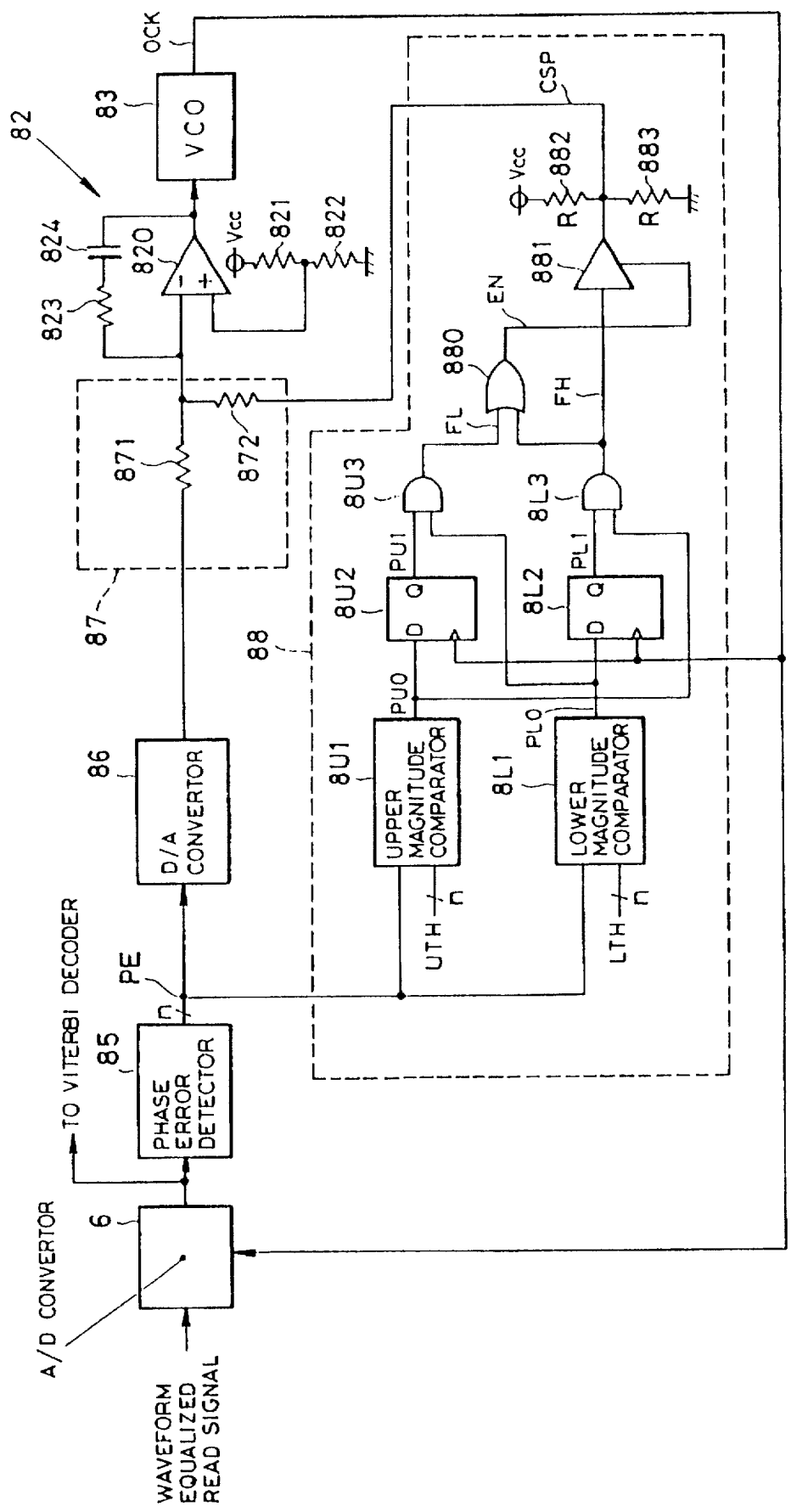
FIG. 5 is a block diagram illustrating a specific configuration of the phase locked loop circuit using a cycle slip detector according to the present invention.

A specific configuration of the phase locked loop circuit 8A is illustrated in FIG. 5.

Referring specifically to FIG. 5, the cycle slip detector 88 comprises upper and lower digital magnitude comparators 8U1, 8L1, D-type flip-flops 8U2, 8L2, AND gates 8U3, 8L3, an OR gate 880, a three-level control circuit 881, and resistors 882, 883. The upper and lower magnitude comparators 8U1, 8L1 serve as first and second determination means, each of which is supplied with the n-bit phase error data from the phase error detector 85 as one input and with n-bit data corresponding to an upper threshold value UTH or n-bit data corresponding to a lower threshold value LTH as another input, and compares these two input values. The upper magnitude comparator 8U1 outputs a high level signal when the phase error data has a value larger than the threshold value UTH, while the lower magnitude comparator 8L1 outputs a high level signal when the phase error data has a value smaller than the threshold value LTH.

A circuit for generating a cycle slip detecting signal from the output signals of the upper and lower magnitude comparators corresponds to a detecting signal generating means. The D-type flip-flops 8U2, 8L2 are supplied with output signals of the upper magnitude comparator 8U1 and the lower magnitude comparator 8L1, individually, as D-inputs and are supplied with the reproduced pulses output from the VCO 83 as a clock input. Q-output signals PU1, PU2 of the D-flip-flops 8U2, 8L2 are supplied to one input of AND gates 8U3, 8L3, individually. The another input of AND gate 8U3 is supplied with an output signal PL0 of the lower magnitude comparator 8L1, while the another input of AND gate 8L3 is supplied with an output signal PU0 of the upper magnitude comparator 8U1. Output signals FL, FH of the AND gates 8U3, 8L3 are input to an OR gate 880 which supplies its output signal EN to a control input terminal of the three-level control circuit 881 including, for example, a three-state buffer. The OR gate 880 may be substituted by an exclusive OR gate. The three-level control circuit 881 is also supplied at its signal input terminal with the output signal FH of the AND gate 8L3 corresponding to the lower side. A signal output terminal of the three-level control circuit 881 is connected to a dividing point of a potential divider formed of a series connection of resistors 882, 883. From the signal output terminal of the three-level control circuit 881, an output detecting signal CSP of the cycle slip detector 88 is delivered.

The adder circuit 87 has resistors 871, 872 through which the cycle slip detecting signal CSP from the cycle slip detector 88 and an analog phase error signal from the D/A convertor 86 are passed, respectively, such that the adder circuit 87 generates its output signal in accordance with the sum of both the signals by a so-called wired system.

An output sum signal of the adder circuit 87 is supplied to an inverting input terminal of an operational amplifier 820 constituting a low pass filter as a loop filter 82. The operational amplifier 820 is also supplied at a non-inverting input terminal with a divided voltage from the potential divider circuit comprising a series connection of the resistors 821, 822. Also, between the inverting input terminal and a signal output terminal of the operational amplifier 820, a feedback circuit comprising a series connection of a resistor 823 and a capacitor 824 is formed. The loop filter 82 also functions as an integrator circuit or an inverting amplifier circuit.

Next, the operation of the phase locked loop circuit will be described with reference to time charts of FIGS. 6 and 7.

Figure 6:
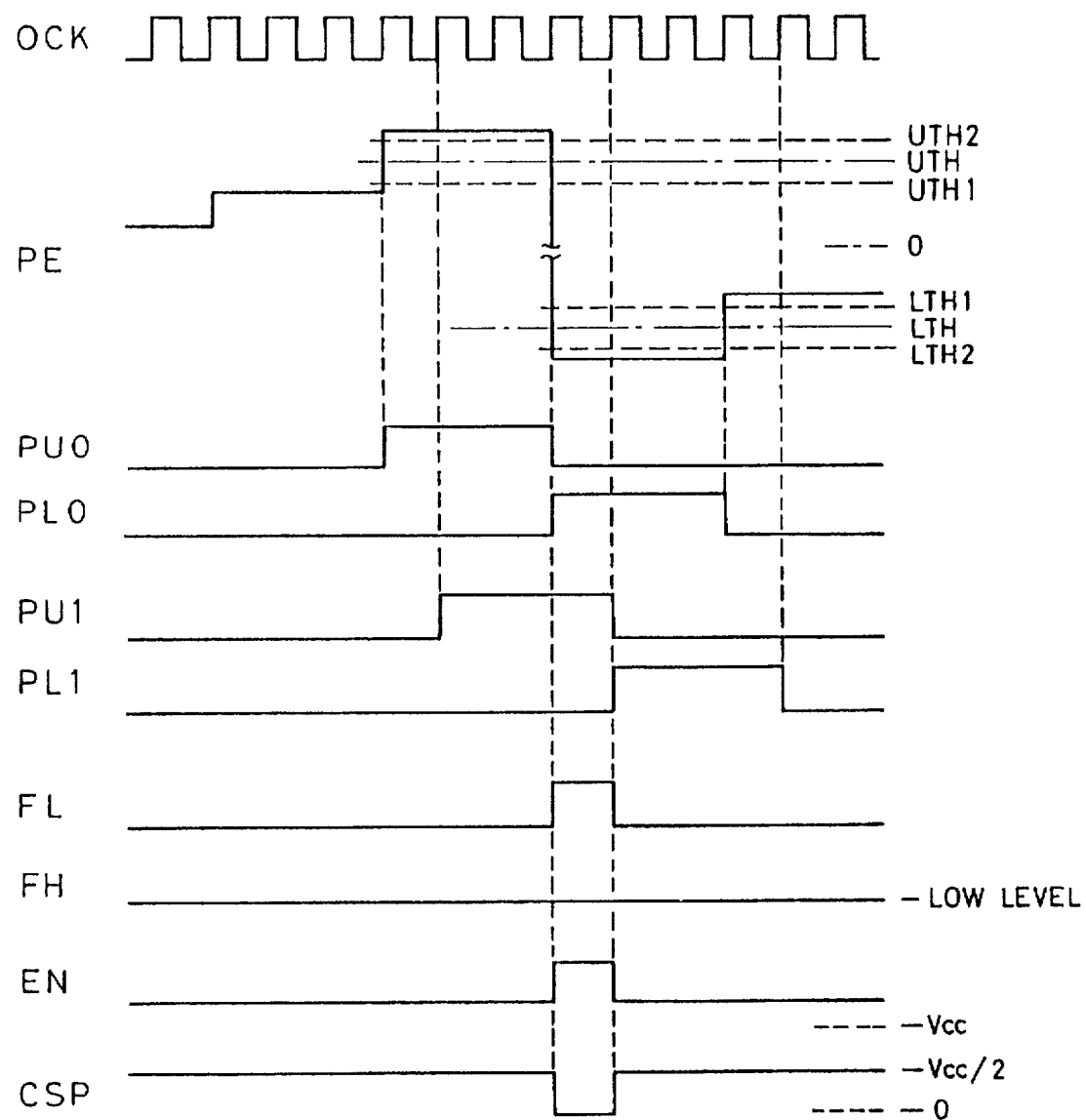
FIG. 6 is a time chart illustrating operational waveforms at various locations in the cycle slip detector when an oscillated frequency of a VCO in the phase locked loop circuit of FIG. 5 is low.

Referring first to FIG. 6, there are illustrated operation waveforms at various locations in the phase locked loop circuit of FIG. 5 when a proper timing frequency for sampling a read signal supplied to the A/D convertor 6 is higher than the oscillating frequency of the VCO 83 so that the oscillating frequency of the VCO 83 is raised to the proper timing frequency of the read signal. In this event, the value of phase error data PE gradually rises over time, abruptly changes to a minimum value immediately after reaching a maximum value to form a cycle slip, and again rises gradually toward the maximum value. The phase error data repeats these changes. The upper magnitude comparator 8U1 has a upper threshold value UTH set at a value smaller than the maximum value of the phase error data PE by a predetermined value, and generates a peak detecting signal PU0 which is at high level while the value of the phase error data PE exceeds this threshold value UTH. The lower magnitude comparator 8L1 has a lower threshold value LTH set at a value larger than the minimum value of the phase error data PE by a predetermined value, and generates a bottom detecting signal PL0 which is at high level while the value of the phase error data PE is below the lower threshold value LTH. The peak and bottom detecting signals PU0, PL0 are delayed by the D-type flip-flops 8U2, 8L2, respectively, by a portion substantially equal to one period of the output reproduced pulses OCK of the VCO 83 to generate corresponding delay signals PU1, PL1.

The AND gate 8U3 generates a falling edge detecting signal FL which goes to high level when the delay signal PU1 and the bottom detecting signal PL0 are simultaneously at high level. A high level portion of the signal FL indicates that phase error has transitted from the upper threshold value UTH to the lower threshold value LTH. In the case of FIG. 6, the phase error signal PE repeats the transition from the upper threshold value UTH to the lower threshold value LTH and does never exhibit a transition from the lower threshold value LTH to the upper threshold value UTH, since the phase error is continuously in a upward trend except for during a cycle slip. Therefore, the delay signal PL1 and the peak detecting signal PU0 are never at high level simultaneously, so that the output signal FH of the AND gate 8L3 remains at low level. The transition of the falling edge detecting signal FL to high level causes the output signal EN of the OR gate 880 to go to high level, resulting in enabling the three-level control circuit 881. In the enabled state, the three-level control circuit 881 is being supplied with the signal FH at low level, so that it outputs the cycle slip detecting signal CSP at low level (ground level).

The cycle slip detecting signal CSP is supplied to the adder circuit 87 which adds this signal CSP to the phase error signal converted to an analog form (the D/A convertor 86 provides an analog output of the input error data PE with its polarity inverted), and this addition output is supplied to the loop filter 82, so that the loop filter 82 generates a control voltage for the VCO 83, the control voltage being shifted upwardly by a predetermined voltage from the phase error signal PE. More specifically, the generation of a low level pulse in the cycle slip detecting signal CSP causes charges in the capacitor 824 to be operated to raise a reference potential at the output terminal of the operational amplifier 820 by one step. Ideally, the width of one step may be made coincident to the dynamic range of the phase error signal (the difference between a maximum value and a minimum value). With the one step rise of the reference potential, even if a cycle slip occurs to cause the phase error signal to abruptly drop from the maximum value to the minimum value, the cycle slip detecting signal CSP having low level is injected to the loop filter 82 to compensate the control voltage of the VCO 83 for the drop by a predetermined amount. Thus, the VCO 83 can continuously raise the oscillating frequency without largely affected by the cycle slip.

Figure 7:
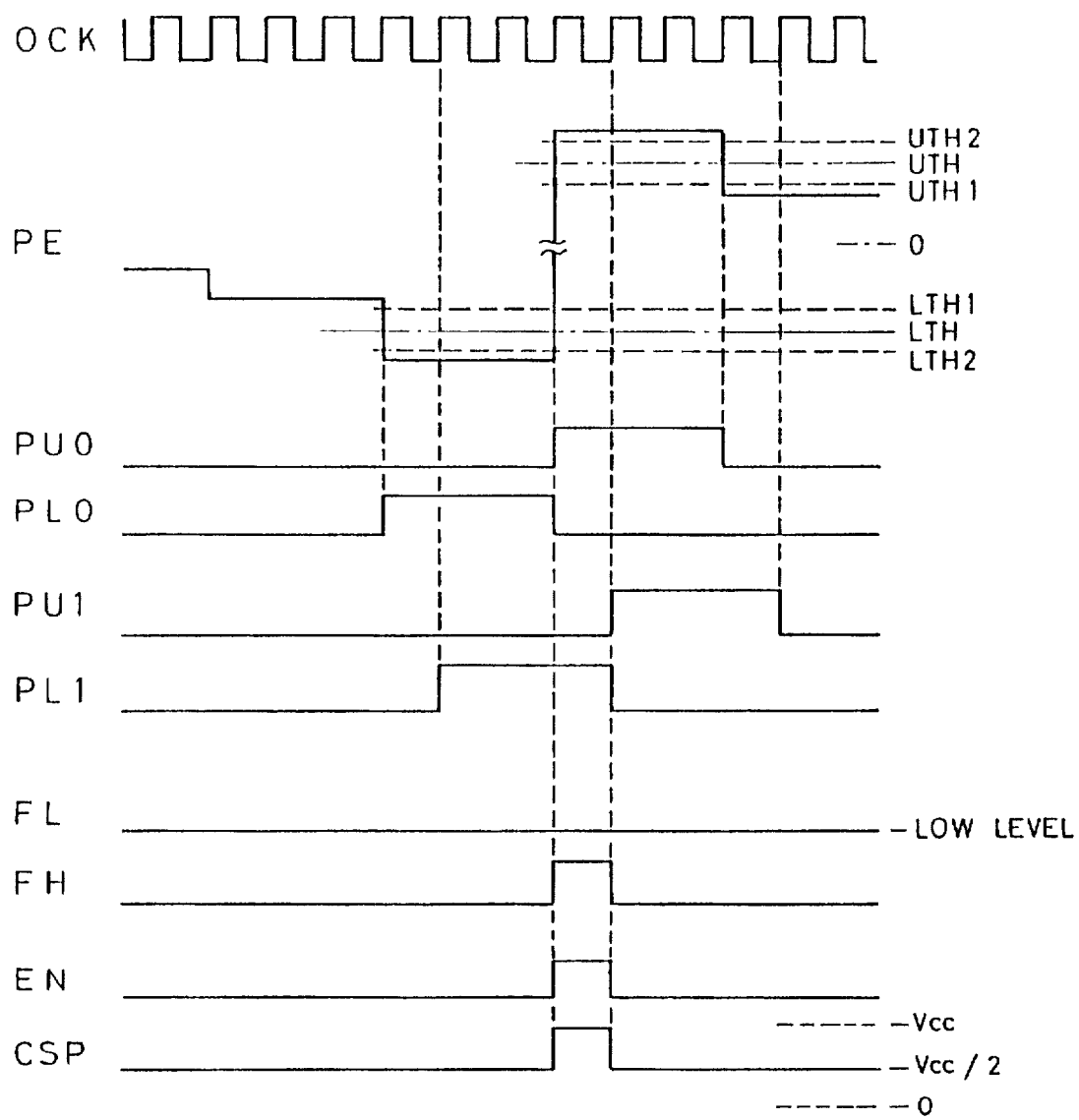
FIG. 7 is a time chart illustrating operational waveforms at various locations in the cycle slip detector when an oscillated frequency of the VCO in the phase locked loop circuit of FIG. 5 is high.

Referring next to FIG. 7, there are illustrated operation waveforms at various locations in the phase locked loop circuit of FIG. 5 when a proper timing frequency for sampling a read signal supplied to the A/D convertor 6 is lower than the oscillating frequency of the VCO 83, so that the oscillating frequency of the VCO 83 is reduced to the proper timing frequency of the read signal. In this event, the value of the phase error data PE gradually descends over time, abruptly changes to a maximum value immediately after reaching a minimum value to form a cycle slip, and again descends gradually toward the minimum value. The phase error data PE repeats these changes. Corresponding to these changes, the peak and bottom detecting signals PU0, PL0 generated by the upper and lower magnitude comparators 8U1, 8L1, unlike the case of FIG. 6, are such that the former goes to high level later than the latter. The delay signals PU1, PL1, generated thereby, exhibit similar behaviors.

The AND gate 8L3 generates a rising edge detecting signal FH which goes to high level when the delay signal PL1 and the peak detecting signal PU0 are simultaneously at high level. A high level portion of the signal FH indicates that the phase error has transitted from the lower threshold value LTH to the upper threshold value UTH. In the case of FIG. 7, the phase error signal PE repeats the transition from the lower threshold value LTH to the upper threshold value UTH and does never exhibit a transition from the upper threshold value UTH to the lower threshold value LTH, since the phase error is continuously in a downward trend except for during the cycle slip. Therefore, the delay signal PU1 and the peak detecting signal PL0 are never at high level simultaneously, so that the output signal FL of the AND gate 8U3 remains at low level. The transition of the rising edge detecting signal FH to high level causes the output signal EN of the OR gate 880 to go to high level, resulting in enabling the three-level control circuit 881. In the enabled state, the three-level control circuit 881 is being supplied with the signal FH at high level, so that it outputs the cycle slip detecting signal CSP at high level (Vcc level).

Also, in this case, the cycle slip detecting signal CSP is supplied to the adder circuit 87 which adds this signal CSP to the phase error signal converted to an analog form, and this addition output is supplied to the loop filter 82, so that the loop filter 82 generates a control voltage for the VCO 83, the control voltage being shifted downward by a predetermined voltage from the phase error signal PE. More specifically, the generation of a high level pulse in the cycle slip detecting signal CSP causes charges in the capacitor 824 to be operated to lower the reference potential at the output terminal of the operational amplifier 820 by one step. Ideally, the width of one step may be made coincident to the dynamic range of the phase error signal (the difference between a maximum value and a minimum value). With the one step down of the reference potential, even if a cycle slip occurs to cause the phase error signal to abruptly rise from the minimum value to the maximum value, the cycle slip detecting signal CSP having high level is injected to the loop filter 82 to compensate the control voltage of the VCO 83 for the rise by a predetermined amount. Thus, the VCO 83 can continuously reduce the oscillating frequency without largely raised by the cycle slip.

The three-level control circuit 881, in turn, is in a floating state when the enable signal EN is at low level, so that the cycle slip detecting signal CSP is clipped to a divided voltage generated by the resistors 882, 883. This divided voltage is an intermediate level (Vcc/2) of a low level (e.g., 0 volt) and a high level (Vcc). Thus, even if such a divided voltage is added to the analog-converted phase error signal as the cycle slip detecting signal CSP, charges accumulated in the capacitor 824 will not be operated stepwise. Accordingly, the VCO 83 can be supplied with a control voltage uniquely having changes in accordance with the phase error signal except for during a cycle slip.

By the operations represented by FIGS. 6 and 7, even if the phase locked loop circuit is in a phase unlocked state, the oscillating frequency of the VCO 83 can be pulled in to the frequency of a read signal. Hence, it is possible to reduce a time required to permit the phase locked loop circuit in an unlock state to lock-in state as well as to conveniently reduce an access time required to read a signal at a specified recording position on an optical disk from the unlock state of the phase locked loop circuit.

Figure 8:
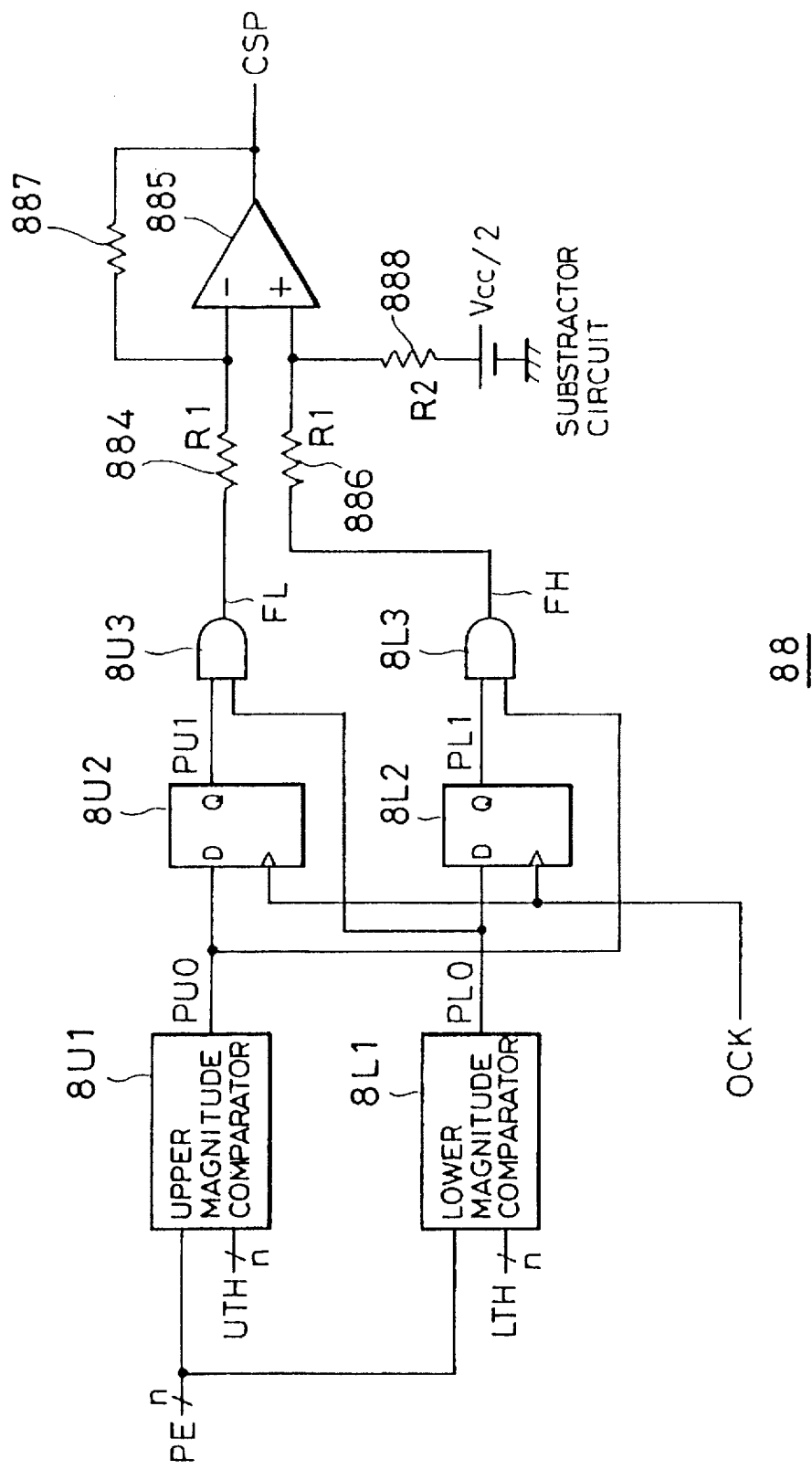
FIG. 8 is a block diagram illustrating a modified example of the cycle slip detector in the phase locked loop circuit of FIG. 5.

The configuration of the cycle slip detector 88 illustrated in FIG. 5 may be modified as shown in FIG. 8.

Referring specifically to FIG. 8, a falling edge detecting signal FL output from an AND gate 8U3 is supplied to an inverting terminal of an operational amplifier 885 through a resistor 884, while a rising edge detecting signal FH output from an AND gate 8L3 is supplied to a non-inverting terminal of the operational amplifier 885 through a resistor 886. Between an output terminal and the inverting input terminal of the operational amplifier 885, a resistor 887 is connected to form a feedback circuit. Between the non-inverting input of the operational amplifier 885 and a ground, a series circuit of a resistor 888 and a regulated or constant voltage source for generating a voltage Vcc/2 is connected. The operational amplifier 885 and the resistors 886–888 constitute a subtractor circuit. It should be noted that the resistors 884, 886 are set at the same resistance value and the resistors 887, 888 are also set at the same resistance value.

This subtractor circuit generates an output signal at low level (0 volt) when the signal FL is at high level and the signal FH is at low level, generates the output signal at high level (Vcc) when the signal FL is at low level and the signal FH is at high level, and generates the output signal at an intermediate level (Vcc/2) when the signals FL and FH are simultaneously at low level. Thus, a cycle slip detecting signal CSP equivalent to that illustrated in FIGS. 6, 7 can be generated. The subtractor circuit is responsible to the functions performed by the OR gate 880, the three-level control circuit 881, and the resistors 882, 883 respectively shown in FIG. 5.

Figure 9:
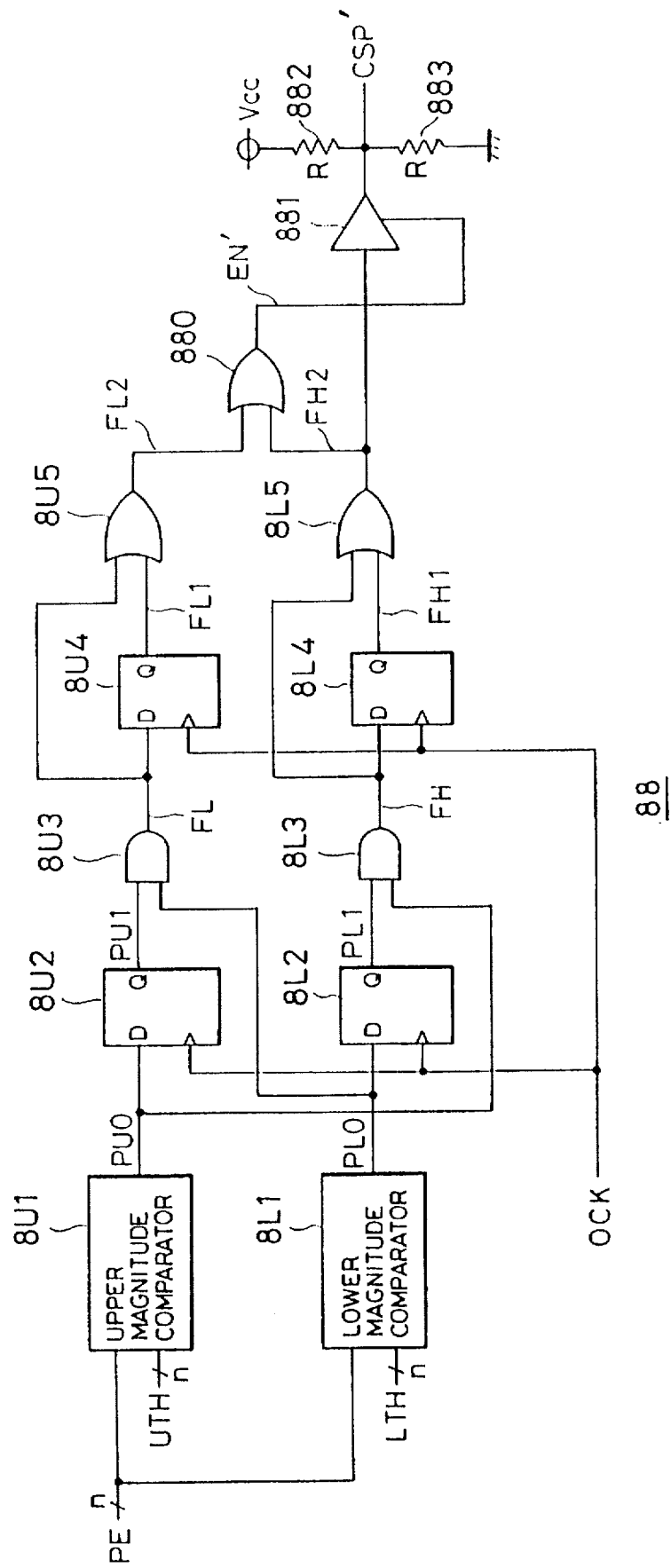
FIG. 9 is a block diagram illustrating another modified example of the cycle slip detector in the phase synchronizing circuit of FIG. 5.

Also, if the matching with the loop filter 82 is additionally taken into consideration, a high level period and a low level period, i.e., a pulse width of the cycle slip detecting signal may be modified, in which case the configuration as illustrated in FIG. 9 may be employed.

Referring specifically to FIG. 9, a falling edge detecting signal FL is supplied to a D-input of a D-type flip-flop 8U4 and to one input of an OR gate 8U5, while a rising edge detecting signal FH is supplied to a D-input of a D-type flip-flop 8L4 and to one input of an OR gate 8L5. The D-type flip-flops 8U4, 8L4 are supplied at their respective clock input terminals with reproduced pulses OCK from the VCO 83, and delivers respective Q-outputs to other inputs of the OR gates 8U5, 8L5, respectively. Output signals of the OR gates 8U5, 8L5 are respectively supplied to an OR gate 880.

With this configuration, the OR gates 8U5, 8L5 respectively take logical OR of the original signal detecting signals FL, FH and signals FL1, FH1 which include high level periods of the detecting signals FL, FH delayed by the D-type flip-flops 8U4, 8L4 by one period of the clock OCK, respectively. The OR gates 8U5, 8L5 therefore deliver at their outputs modified falling edge and rising edge detecting signals FL2, FH2 which have longer pulse widths with high level periods of the original signals FL, FH extended by one period of the clock OCK. Correspondingly, the OR gate 880 also delivers at its output a similarly modified enable signal EN', thus making it possible to generate a cycle slip detecting signal CSP' having a longer pulse width.

As described above, the D-type flip-flops 8U4, 8L4 and the OR gates 8U5, 8L5 are responsible to an extension function for providing a longer pulse width for the cycle slip detecting signal, in addition to the configuration illustrated in FIG. 5. Alternatively, this function may be implemented by an MMV (Monostable Multivibrator) configuration. More specifically, the original detecting signals FL, FH are respectively used as trigger signals, two MMV's are employed to generate output signals FLM, FHM which indicate high level over a predetermined period from the time the trigger inputs have been supplied thereto, and output signals of the MMV's are input to the OR gate 880 in the configuration of FIG. 5. Alternatively, if the configuration of FIG. 8 is employed, the output signals FLM, FHM of the MMV's may be supplied to the subtractor circuit, instead of the original detecting signals FL, FH. The advantage of the extension function provided by the MMV's is that the pulse width of the cycle slip detecting signal can be freely determined by changing the setting of the MMV's.

While the foregoing configuration is an example of providing a longer pulse width for the cycle slip detecting signal, another configuration may be employed for reducing the pulse width, on the contrary. For reducing the pulse width in the configuration of FIG. 5, for example, the clock signal from the VCO 83 is multiplied to generate a clock signal having a shorter period which is then supplied to the clock inputs of the D-type flip-flops 8U2, 8L2. Other than this, there are a variety of methods for the same purpose. Alternatively, other than the configuration using D-type flip-flops to delay signals, delay lines may be used to delay signals. More specifically, in FIGS. 5 and 8, corresponding delay lines may be substituted for the D-type flip-flops 8U2, 8L2 to create predetermined delay times set in the delay lines (corresponding to the pulse widths of the original detecting signals FL, FH). Advantageously, the delay times thus created may be made longer or shorter by appropriately selecting delay lines to be used.

Figure 10:
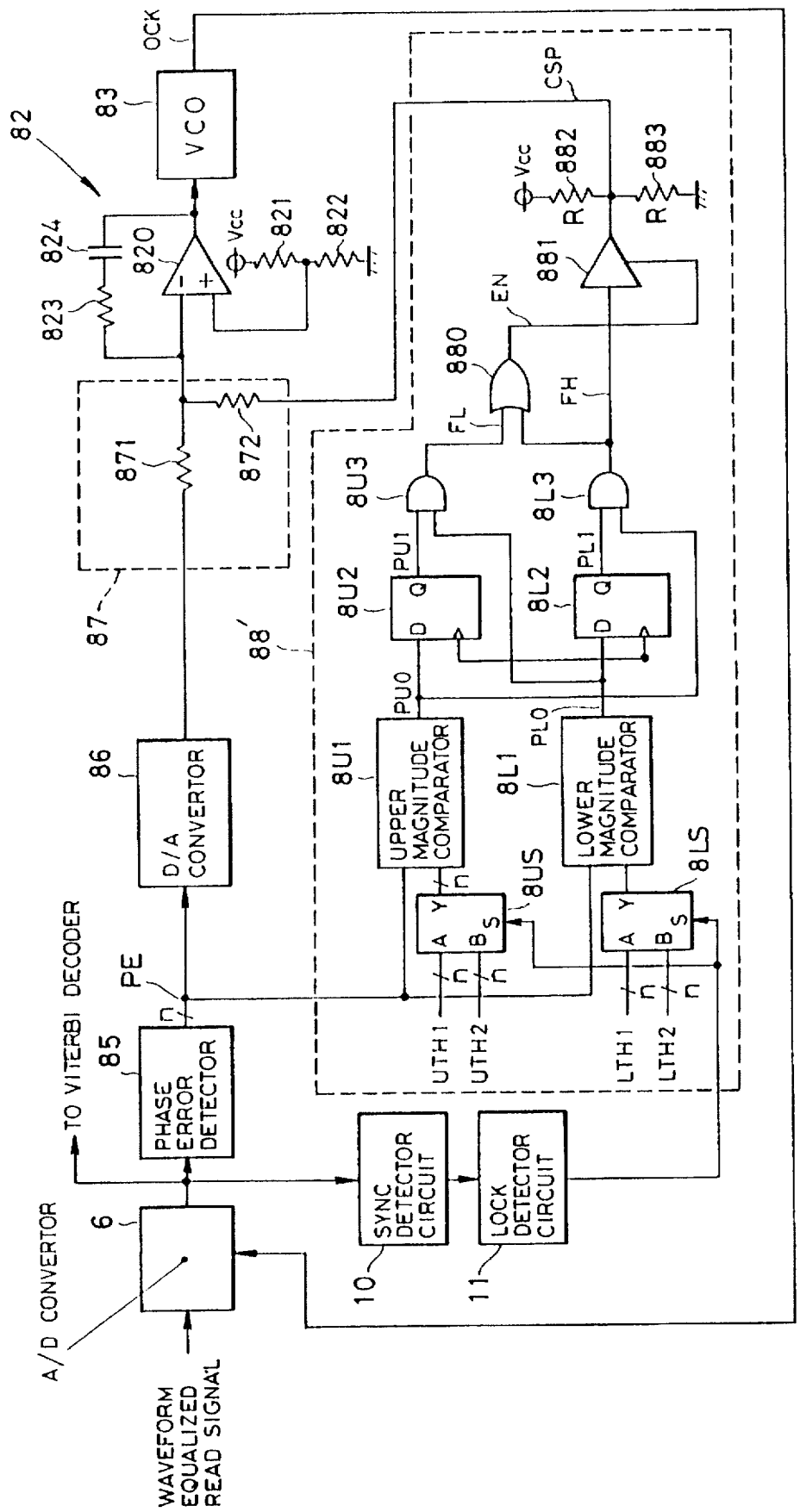
FIG. 10 is a block diagram illustrating a specific configuration of a phase locked loop circuit using a threshold switching type cycle slip detector of another embodiment according to the present invention.

Next, FIG. 10 illustrates the configuration of a phase locked loop circuit particularly effective in use for an apparatus for reproducing information recorded on an optical disk which serves as a recording medium.

Referring specifically to FIG. 10, a cycle slip detector 88' has selectors 8US, 8LS for switching between respective comparison reference values for upper and lower digital magnitude comparators 8U1, 8L1. The upper selector 8US is supplied with first and second upper threshold values UTH1, UTH2, later described, while the lower selector 8LS is supplied with first and second lower threshold values LTH1, LTH2, also later described. An output digital signal of an A/D convertor 6 is supplied to a sync detector circuit 10 which determines whether or not a digital signal having a synchronizing signal pattern is being supplied using a so-called pattern recognition processing. A lock detecting circuit 11 generates a lock detecting signal at high level when detecting that a synchronizing signal reaches at predetermined periods, based on determination results of the sync detector circuit 10. This lock detecting signal is supplied to the selectors 8U2, 8LS as a selection control input. It should be noted that a state in which the synchronizing signal reaches at predetermined periods, detected by the lock detector circuit 11, corresponds to a state in which a sampling frequency at which a read signal is to be sampled is sufficiently close to the oscillating frequency of the VCO 83 so that the phase locked loop circuit is entered in a lock-in range.

Figure 11:
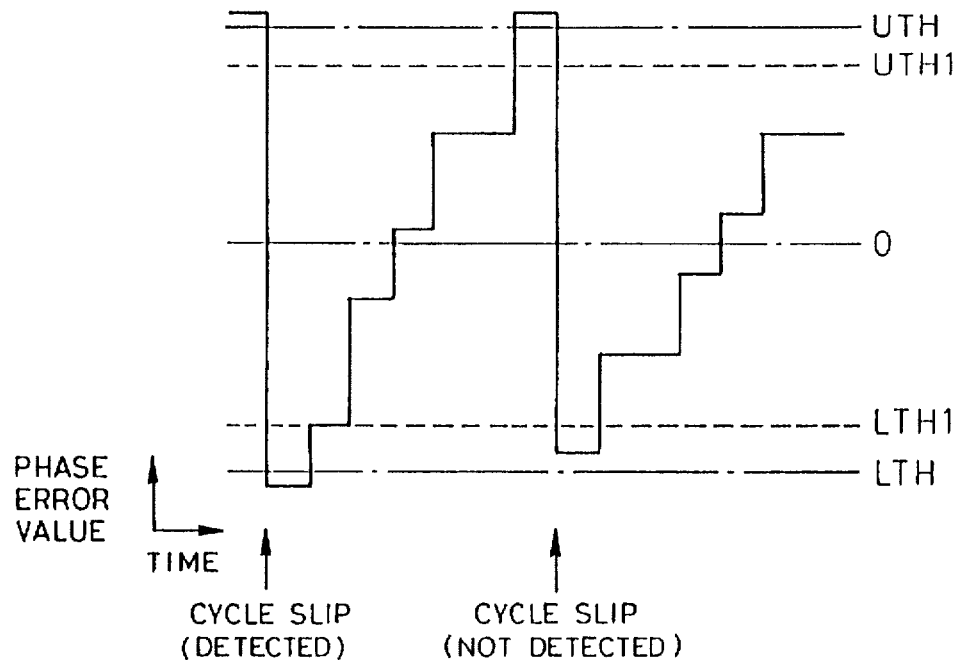
FIG. 11 is a diagram representing a relationship between threshold values of upper and lower magnitude comparators and phase errors, when a PLL is not in a lock state, for explaining the effect of the phase locked loop circuit illustrated in FIG. 10.

If no lock detecting signal is generated and hence the selection control inputs of the respective selectors are at low level, the respective selectors select an A-input to provide the first upper and lower threshold values UTH1, LTH1 to the upper and lower magnitude comparators 8U1, 8L1 as comparison reference values. The first upper and lower threshold values UTH1, LTH1, are set to values relatively close to a center value (0) of the phase error signal PE, for example, as illustrated in FIGS. 6 and 7. This setting is made by the following reasons. Since a cycle slip is more likely to occur due to a phase error during an unlocked state of the phase locked loop circuit, the first upper and lower threshold values UTH1, LTH1 are set as mentioned above in order to facilitate the detection of the cycle slip and to prevent a failure in detecting the same. More specifically explaining with reference to FIG. 11, during the unlock state, if absolute values of UTH, LTH are too large, errors included in the detecting operation of the phase error detector 85, for example, may cause frequent occurrence of a situation in which phase errors do not exceed the absolute values of UTH, LTH in spite that cycle slips are occurring, whereby the cycle slip detector fails to detect the cycle slip every time it occurs. Conversely, if UTH1, LTH1 are set to have small absolute values close to the center value of the phase error signal PE, the phase error is more likely to exceed the absolute values of UTH1, LTH1, thus avoiding the failure in detecting the cycle slip.

Figure 12:
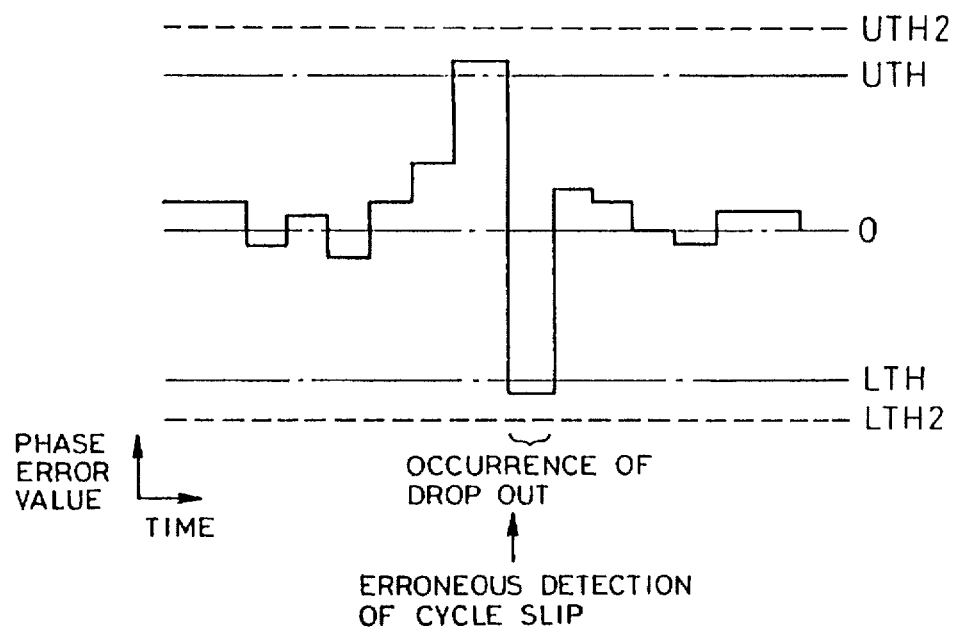
FIG. 12 is a diagram representing a relationship between threshold values of the upper and lower magnitude comparators and phase errors, when a PLL is in a lock state, for explaining the effect of the phase locked loop circuit illustrated in FIG. 10.

On the other hand, when the lock detecting signal is generated and hence the selection control inputs of the respective selectors 8US, 8LS are at high level, the respective selectors select a B-input to provide the second upper and lower threshold values UTH2, LTH2 to the upper and lower magnitude comparators 8U1, 8L1 as comparison reference values. The second upper and lower threshold values UTH2, LTH2, similarly as illustrated in FIGS. 6 and 7, are set to values relatively close to a maximum value and a minimum value of the phase error signal. In other words, absolute values of UTH2, LTH2 are set to be larger than the absolute values of UTH1, LTH1 by a predetermined value. This setting is made by the following reasons. Since a cycle slip essentially does not occur during a lock state of the phase locked loop circuit, the second upper and lower threshold values UTH2, LTH2 are set as mentioned above in order to prevent the detection of the cycle slip and to prevent erroneous detection of the same. More specifically explaining with reference to FIG. 12, during the lock state, if absolute values of UTH, LTH are too small, drop out or the like, for example, may cause frequent occurrence of a situation in which phase errors exceed the absolute values of UTH, LTH in spite that no cycle slip is occurring, whereby the cycle slip detector detects a cycle slip every time the phase error exceeds the absolute value of UTH or LTH. Conversely, if UTH2, LTH2 are set to have large absolute values close to positive and negative peak values of the phase error signal PE, the phase error is less likely to exceed the absolute values of UTH2, LTH2, thus avoiding erroneous detection of the cycle slip.

As described above, proper comparison reference values are given to the upper and lower magnitude comparators 8U1, 8L1 separately for the unlock state and the lock state to simultaneously solve two contradictory problems, i.e., a prevention of a failure in detecting the cycle slip during the unlock state and a prevention of erroneous detection of the cycle slip during the lock state. Generally, in a disk system, the phase locked loop circuit is in a lock state during normal reproduction but in an unlock state in a pull-in operation after a reading location has been moved to a specified recording position on a disk. With the configuration as described above, the cycle slip can be favorably detected in both the lock state and the unlock state.

Figure 13:
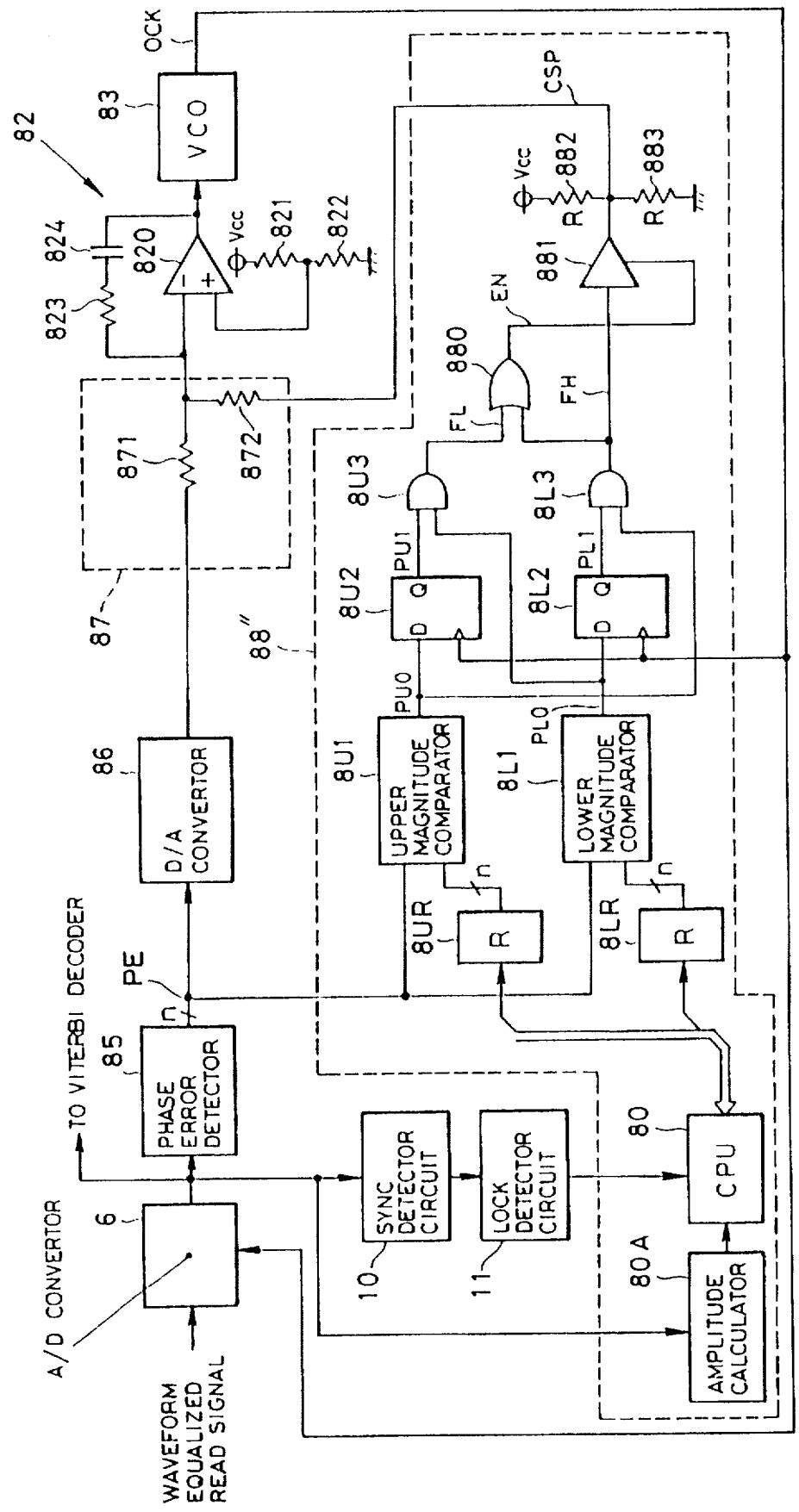
FIG. 13 is a block diagram illustrating a specific configuration of a phase locked loop circuit using a variable threshold type cycle slip detector of another embodiment according to the present invention.

The effect of the phase locked loop circuit of FIG. 10 may also be realized by the configuration as illustrated in FIG. 13.

Referring specifically to FIG. 13, registers 8UR, 8LR capable of holding n-bit data provide upper and lower magnitude comparators 8U1, 8L1 with comparison reference values instead of selectors. The registers 8UR, 8LR are supplied with n-bit data from a CPU 80 and fetch the input data in response to a rewrite instruction from the CPU 80. The CPU 80 is supplied with a lock detecting signal from a lock detector circuit 11. The CPU 80 monitors the lock detecting signal and, in response to the lock detecting signal transitting from high level to low level, transfers data corresponding to the first upper threshold value UTH1 to the register 8UR and data corresponding to the first lower threshold value LTH1 to the register 8LR, together with the rewrite instruction. Also, the CPU 80, in response to a transition of the lock detecting signal from low level to high level, transfers data corresponding to the second upper threshold value UTH2 to the register 8UR and data corresponding to the second lower threshold value LTH2 to the register 8LR, together with the rewrite instruction. This results in producing similar effects as those provided by the phase locked loop circuit illustrated in FIG. 10.

A cycle slip detector 88" in FIG. 13 is further provided with an amplitude calculator 80A. The amplitude calculator 80A calculates an average amplitude value of a read signal on the basis of an output digital signal of an A/D convertor 6, and transfers the calculation result to the CPU 80. The average amplitude value depends on the reflectivity or transmittance of a recording surface of a disk relative to particular reading light, the intensity of the reading light, and so on. Thus, the CPU 80 calculates optimal upper and lower comparison reference values for a transferred average amplitude value and writes dada corresponding to the calculated comparison reference values into the registers 8UR, 8LR, thereby making it possible to detect a cycle slip always in the best condition even if data is read from a different disk, or even if the optical characteristic of a disk suffers from aging changes while data is being read from the disk. For example, since the optical characteristic relative to reading light differs relatively largely between SD-ROM and SD-RAM and between SD-ROM and CD, it is highly advantageous to set the comparison reference values in accordance with an average amplitude value of a signal read from a particular medium. It should be noted that changes in the optical characteristic relative to reading light emitted to a disk may be sensed from a peak value of a read signal instead of an average amplitude value of the read signal. In short, any method may be employed as long as the threshold values set to the comparators 8U1, 8L1 are changed in correspondence to the dynamic range of a phase error values caused by changes in the level of an input signal to the A/D convertor 6. In addition, the update to the contents of the registers 8UR, 8LR in accordance with an average amplitude value of a read signal may be performed constantly, or only upon starting reproduction, or at edge timing of the lock detecting signal.

Figure 14:
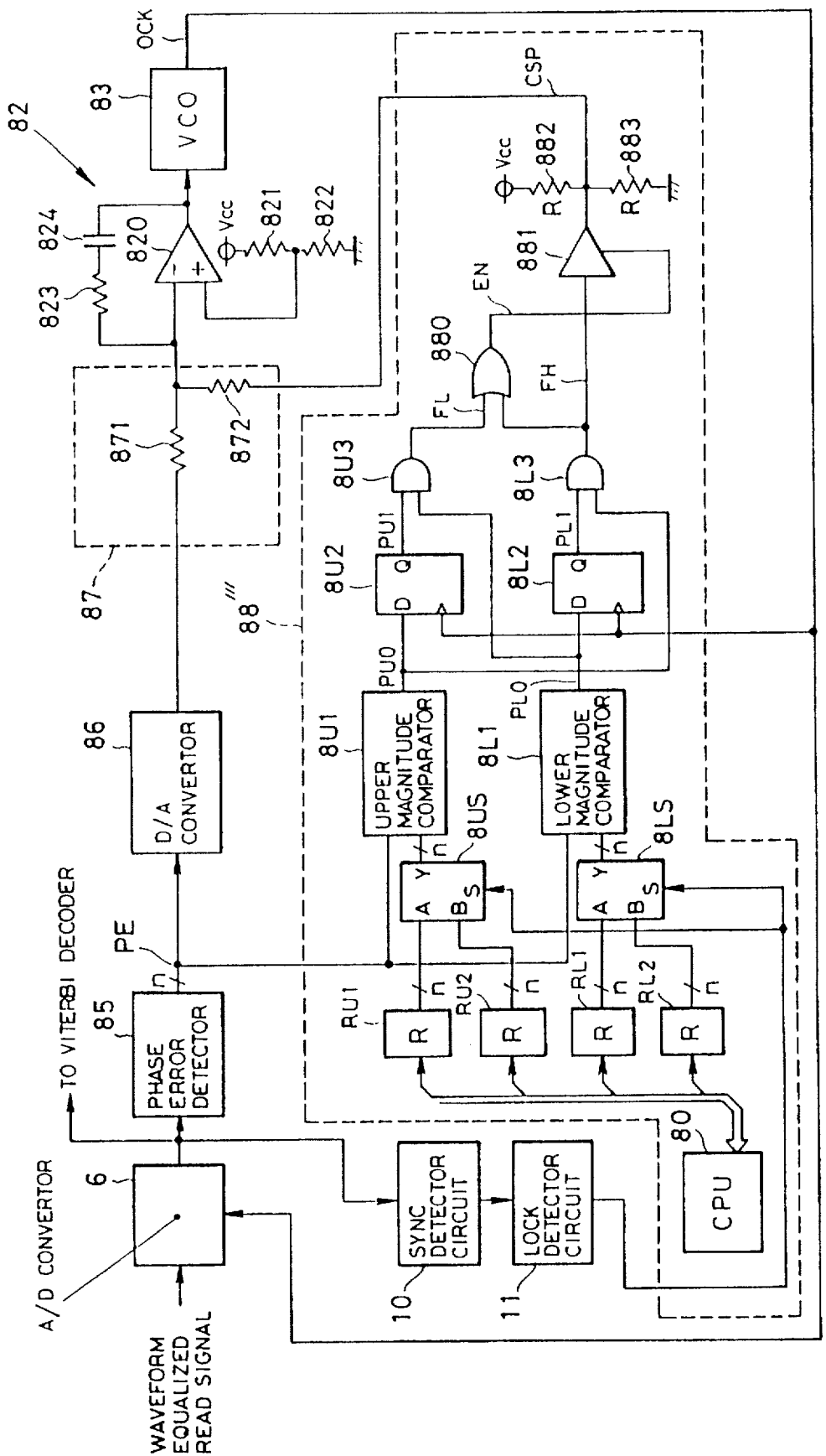
FIG. 14 is a block diagram illustrating a specific configuration of a phase locked loop circuit using a switched and variable threshold type cycle slip detector of a further embodiment according to the present invention.

FIG. 14 illustrates another phase locked loop circuit including a further modified cycle slip detector 88'''.

Referring specifically to FIG. 14, the cycle slip detector 88''' is provided with registers RU1, RU2, RL1, RL2 each capable of holding n-bit data, a selector 8US supplied with output data of the upper registers RU1, RU2, and a selector 8LS supplied with output data of lower registers RL1, RL2. These registers provides comparison reference values for upper and lower magnitude comparators 8U1, 8L1. Each register is supplied with n-bit data from a CPU 80, and fetches the input data in response to a rewrite instruction from the CPU 80. The CPU 80 writes data corresponding to the first and second threshold values UTH1, LTH1 into the registers RU1, RL1, and data corresponding to the second upper and lower threshold values UTH2, LTH2 into the registers RU2, RL2. The selectors 8US, 8LS are supplied with a lock detecting signal from a lock detector circuit 11. The selectors 8US, 8LS selects an A-input, when the lock detecting signal is at low level (unlock state), to output data corresponding to UTH1, LTH1 held in the registers RU1, RL1 to the upper and lower magnitude comparators 8U1, 8L1, respectively. Conversely, the selectors 8US, 8LS select a B-input, when the lock detecting signal is at high level (lock state), to output data corresponding to UTH2, LTH2 to the upper and lower magnitude comparators 8U1, 8L1, respectively.

While the foregoing configuration can produce effects similar to those produced by the phase locked loop circuit of FIG. 10, the cycle slip detector 88''' of FIG. 14 is more versatile than the cycle slip detector 88' illustrated in FIG. 10 in view of its capability of variably holding respective threshold value data in the registers. More specifically, it is possible to change threshold value data in accordance with the characteristic of a particular VCO 83, and possible change threshold value data in accordance with variations in the optical characteristic of disks relative to the reading light beam, as is also achieved by the phase locked loop circuit of FIG. 13. Accordingly, it is possible to realize a cycle slip detector which is applicable to phase locked loop circuits in a variety of systems, not limited to phase locked loop circuits in disk systems as the examples heretofore described. Also, since threshold value data corresponding to the lock/unlock states are individually held in the registers such that the selectors are switched by the lock detecting signal to directly supply the threshold value data held in the registers to the magnitude comparators, the configuration of FIG. 14 is advantageous over the configuration of FIG. 13 in that a better response to lock/unlock is provided.

While various examples of modified cycle slip detectors have been so far illustrated, the adder circuit side in the phase locked loop may be principally modified as illustrated in FIG. 15.

Referring specifically to FIG. 15, a cycle slip detector 88'''' outputs rising edge and falling edge detecting signals FL, FH as cycle slip detecting signals. More specifically, a transition of either of these two detecting signals to high level corresponds to the occurrence of a cycle slip. The detecting signals FL, FH are respectively supplied to a negative value data generator 873 and a positive data generator 874 in an adder circuit. The negative value data generator 873 generates an n-bit digital signal corresponding to a predetermined negative value when the detecting signal FH goes to high level. The positive value data generator 874, in turn, generates an n-bit digital signal corresponding to a predetermined positive value when the detecting signal FL goes to high level. The negative value and positive value data generators 873, 874 respectively generate an n-bit digital signal corresponding to zero, when the respective input detecting signals supplied thereto are at low level. Such negative value data and positive value data are supplied to a digital adder 870 together with a digital phase error signal PE to generate data corresponding to a total sum of these input data values. The total sum data generated by the digital adder 870 is sent to a D/A convertor 86 for analog conversion, and then the analog total sum signal is supplied to a filter 82.

The foregoing configuration can also produce effects common to the respective embodiment described above. In addition, the configuration of FIG. 15 is advantageous in that since the output portion of the cycle slip detector to the adder circuit are implemented by digital circuits, it is more easy to integrate these circuits in a digital form.

While in the foregoing respective embodiments, the phase error signal has both positive and negative values, the present invention may be applicable to the case where the phase error signal only has values with one of the two polarities, e.g., positive values, as long as phase errors have a maximum value and a minimum value.

As described above in detail, according to the cycle slip detector of the present invention, when it is determined that the value of a supplied phase error signal is larger than a first threshold value near a maximum value possibly taken by phase errors, a first determining signal is responsively generated. Also, when it is determined that the value of the supplied phase error signal is smaller than a second threshold value near a minimum value possibly taken by the phase errors, a second determining signal is responsively generated. Then, when the first determining signal and the second determining signals are generated in succession, a cycle slip detecting signal is generated. Also, according to the phase locked loop circuit of the present invention, the cycle slip detecting signal is added to the phase error signal supplied to a loop filter. Further, according to the digital signal reproducing apparatus of the present invention, a read signal is sampled based on a sampling timing signal, converted to a digital form, and outputted as a digital signal. Also, a phase error signal is generated in accordance with phase errors relative to the sampling timing in the digital conversion of the read signal. A phase synchronizing signal (reproduced output signal by PLL) generated by the phase locked loop circuit is used as the sampling timing signal.

It is therefore possible to provide a phase locked loop circuit having a wide frequency range in which a withdraw or pull-in operation is permitted and a cycle slip detector suitable for such a phase locked loop circuit. Also, in the digital signal reproducing apparatus, it is possible to reduce an access time required to read a signal at a specified recording position on a recording medium from an unlock state of the phase locked loop circuit.

What is claimed is:

1. A cycle slip detector for detecting a cycle slip in a phase error signal, comprising:

first determining means for determining that the value of said phase error signal being supplied thereto is larger than a first threshold value near a maximum value possibly taken by said phase error signal to generate a first determining signal;

second determining means for determining that the value of said phase error signal being supplied thereto is smaller than a second threshold value near a minimum value possibly taken by said phase errors to generate a second determining signal; and detecting signal generating means for generating a cycle slip detecting signal when said first determining signal and said second determining signal are generated in succession.

2. A cycle slip detector according to claim 1, wherein said first and second threshold values are variable.

3. A phase locked loop circuit for generating a phase synchronizing signal synchronized in phase to an input signal, comprising:

error detecting means for detecting a phase error in said input signal and for generating a phase error signal in accordance the detected phase error;

a cycle slip detector including first determining means for determining that the value of said phase error signal being supplied thereto is larger than a first threshold value near a maximum value possibly taken by said phase error signal to generate a first determining signal; second determining means for determining that the value of said phase error signal being supplied thereto is smaller than a second threshold value near a minimum value possibly taken by said phase error signal to generate a second determining signal; and detecting signal generating means for generating a cycle slip detecting signal when said first determining signal and said second determining signal are generated in succession;

an adding means for adding said phase error signal and said cycle slip detecting signal to generate a sum signal in accordance with an addition value of both said signals;

a loop filter for passing a low frequency component of said sum signal therethrough; and oscillating means for generating said phase synchronizing signal having an oscillating frequency and a phase in accordance with said low frequency component.

4. A phase locked loop circuit according to claim 3, further comprising digitizing means for converting said input signal to a digital signal using a sampling timing signal to output the digital signal, wherein said error detecting means detects a phase error in sampling timing of the digitizing means relative to said input signal, and generates said phase error signal in response to the detection of the phase error.

5. A phase locked loop circuit according to claim 3, further comprising:

pull-in state detecting means for detecting that the oscillating frequency of said oscillating means is within a phase pull-in possible frequency range to generate a pull-in state detecting signal; and threshold value setting means for changing said first and second threshold values in response to said pull-in state detecting signal.

6. A phase locked loop circuit according to claim 5, wherein said threshold value setting means makes the difference between said first threshold value and said second threshold value during a period in which said pull-in state detecting signal is generated larger than the difference between said first threshold value and said second threshold value during a period in which said pull-in state detecting signal is not generated.

7. A phase locked loop circuit according to claim 3, further comprising an input signal evaluating means for detecting an average amplitude value or a peak value of said input signal, wherein said threshold setting means changes said first and second threshold values in response to said average amplitude value or said peak value.

8. A phase locked loop circuit according to claim 3, wherein said cycle slip detecting signal is a pulse signal, and said phase locked loop circuit further comprising means for making the pulse width of said cycle slip detecting signal variable.

9. A phase locked loop circuit according to claim 3, wherein said detecting signal generating means generates a cycle slip detecting signal having a first level when said second determining signal is generated subsequent to the generation of said first determining signal, and generates a cycle slip detecting signal having a second level with a polarity reverse to said first level relative to a reference level when said first determining signal is generated subsequent to the generation of said second determining signal.

10. A digital signal reproducing apparatus for reproducing a digital signal from a read signal acquired by reading a recording medium, comprising:

digitizing means for converting said reading signal to a digital form using a sampling timing signal and for outputting a digital signal;

error detecting means for detecting a phase error in sampling timing of said digitizing means relative to said read signal to generate a phase error signal in accordance with said phase error;

a cycle slip detector including first determining means for determining that the value of said phase error signal being supplied thereto is larger than a first threshold value near a maximum value possibly taken by said phase error signal to generate a first determining signal; second determining means for determining that the value of said phase error signal being supplied thereto is smaller than a second threshold value near a minimum value possibly taken by said phase error signal to generate a second determining signal; and detecting signal generating means for generating a cycle slip detecting signal when said first determining signal and said second determining signal are generated in succession;

adding means for adding said phase error signal and said cycle slip detecting signal to generate a sum signal in accordance with an addition value of both said signals;

a loop filter for passing a low frequency component of said sum signal therethrough;

oscillating means for generating said sampling timing signal having an oscillating frequency and a phase in accordance with said low frequency component; and decoding means for decoding said digital signal.

* * * * *